United States Patent
Basceri et al.

(10) Patent No.: US 7,192,828 B2
(45) Date of Patent: Mar. 20, 2007

(54) CAPACITOR WITH HIGH DIELECTRIC CONSTANT MATERIALS AND METHOD OF MAKING

(75) Inventors: Cem Basceri, Boise, ID (US); Gurtej S. Sandhu, Boise, ID (US); Sam Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/819,420

(22) Filed: Apr. 7, 2004

(65) Prior Publication Data

US 2004/0191983 A1    Sep. 30, 2004

Related U.S. Application Data

(63) Continuation of application No. 09/903,160, filed on Jul. 11, 2001, now Pat. No. 6,727,140.

(51) Int. Cl.
H01L 21/8242    (2006.01)

(52) U.S. Cl. .................. 438/240; 438/770; 257/E21.01

(58) Field of Classification Search .......... 257/E21.01, 257/E21.009; 438/770, 396, 239, 240
See application file for complete search history.

(56) References Cited

U.S. PATENT DOCUMENTS

| | | | |
|---|---|---|---|
| 4,984,038 A | | 1/1991 | Sunami |
| 5,272,417 A | * | 12/1993 | Ohmi .................. 315/111.21 |
| 5,554,866 A | * | 9/1996 | Nishioka et al. ............ 257/295 |
| 5,714,402 A | * | 2/1998 | Choi .......................... 438/396 |
| 5,786,248 A | | 7/1998 | Schuegraf |
| 5,814,852 A | | 9/1998 | Sandhu et al. |
| 5,837,593 A | | 11/1998 | Park et al. |
| 5,859,760 A | | 1/1999 | Park et al. |
| 5,918,118 A | * | 6/1999 | Kim et al. ................... 438/238 |
| 5,935,650 A | | 8/1999 | Lerch et al. |
| 5,985,730 A | * | 11/1999 | Lim ........................... 438/393 |
| 5,994,153 A | | 11/1999 | Nagel et al. |
| 5,994,183 A | | 11/1999 | Huang et al. |
| 6,017,789 A | | 1/2000 | Sandhu et al. |
| 6,030,847 A | | 2/2000 | Fazan et al. |
| 6,133,159 A | | 10/2000 | Vaartstra et al. |

(Continued)

FOREIGN PATENT DOCUMENTS

JP    03257857 A  *  11/1991

(Continued)

OTHER PUBLICATIONS

S. Wolf, Silicon Processing for the VLSI Era, vol. 2, Lattice Press (1990) pp. 587-597.*

(Continued)

*Primary Examiner*—Caridad Everhart
(74) *Attorney, Agent, or Firm*—Dinsmore & Shohl LLP (57) ABSTRACT

A stabilized capacitor using non-oxide electrodes and high dielectric constant oxide dielectric materials and methods of making such capacitors and their incorporation into DRAM cells is provided. A preferred method includes providing a non-oxide electrode, oxidizing an upper surface of the non-oxide electrode, depositing a high dielectric constant oxide dielectric material on the oxidized surface of the non-oxide electrode, and depositing an upper layer electrode on the high dielectric constant oxide dielectric material.

11 Claims, 5 Drawing Sheets

U.S. PATENT DOCUMENTS

| | | | |
|---|---|---|---|
| 6,140,229 | A | 10/2000 | Sumi |
| 6,143,598 | A * | 11/2000 | Martin et al. ............... 438/240 |
| 6,162,744 | A | 12/2000 | Al-Shareef et al. |
| 6,165,834 | A | 12/2000 | Agarwal et al. |
| 6,239,461 | B1 | 5/2001 | Lee |
| 6,281,142 | B1 | 8/2001 | Basceri et al. |
| 6,319,542 | B1 | 11/2001 | Sumerfelt et al. |
| 6,344,662 | B1 | 2/2002 | Dimitrakopoulos et al. |
| 6,362,501 | B1 | 3/2002 | Kim |
| 6,372,097 | B1 * | 4/2002 | Chen .......................... 204/176 |
| 6,486,020 | B1 | 11/2002 | Thakur et al. |
| 6,498,094 | B2 * | 12/2002 | Nakao et al. ............... 438/650 |
| 6,630,702 | B2 * | 10/2003 | Zhang et al. ............... 257/295 |
| 6,727,140 | B2 * | 4/2004 | Basceri et al. ............. 438/240 |
| 6,902,939 | B2 * | 6/2005 | Moise et al. ................. 438/3 |
| 2002/0047148 | A1 | 4/2002 | Won et al. |
| 2004/0183142 | A1 * | 9/2004 | Matsuo et al. ............. 257/406 |

FOREIGN PATENT DOCUMENTS

| | | | |
|---|---|---|---|
| JP | 11-121711 A | * | 4/1999 |
| JP | 11121711 A | * | 4/1999 |

OTHER PUBLICATIONS

John R. Hollahan and Alexis T. Bell, Techniques and Applications of Plasma Chemistry, John Wiley & Sons (1974) pp. 26-28 and 47-48.*

Tsunemine et al., "A manufacturable integration technology of sputter-BST capacitor with a newly proposed thick Pt electrode", IEEE, 1998, pp. 30.3.1-30.3.4.

* cited by examiner

CAPACITOR WITH HIGH DIELECTRIC CONSTANT MATERIALS AND METHOD OF MAKING

CROSS REFERENCE TO RELATED APPLICATIONS

This application is a continuation of U.S. patent application Ser. No. 09/903,160 filed Jul. 11, 2001 now U.S. Pat. No. 6,727,140.

BACKGROUND OF THE INVENTION

This invention relates generally to capacitors, and more particularly to capacitors made with non-oxide electrodes and oxide dielectrics having high dielectric constants but with reduced leakage current, and to methods of making such capacitors and their incorporation into DRAM cells.

The increase in memory cell density in DRAMs presents semiconductor chip designers and manufacturers with the challenge of maintaining sufficient storage capacity while decreasing cell area. One way of increasing cell capacitance is through cell structure techniques, including three dimensional cell capacitors. The continuing drive to decrease size has also led to consideration of materials with higher dielectric constants for use in capacitors. Dielectric constant is a value characteristic of a material and is proportional to the amount of charge that can be stored in a material when the material is interposed between two electrodes. Promising dielectric materials include $Ba_xSr_{(1-x)}TiO_3$ ("BST"), $BaTiO_3$, $SrTi)O_3$, $PbTiO_3$, $Pb(Zr,Ti)O_3$ ("PZT"), $(Pb,La)(Zr,Ti)$ ("PLZT"), $(Pb,La)TiO_3$ ("PLT"), $KNO_3$, $Nb_2O_5$, $Ta_2O_5$, and $LiNbO_3$, all of which have high dielectric constants making them particularly desirable for use in capacitors. However, the use of these materials has been hampered by their incompatibility with current processing techniques and their leakage current characteristics. The leakage current characteristics of $Ta_2O_5$ on electrodes such as polysilicon, W, $WN_x$, and TaN are not as good as those of the conventional silicon nitride capacitor.

Leakage current is controlled not only by the quality of the $Ta_2O_5$ dielectric film, but also by the state of the interface between the $Ta_2O_5$ film and the electrodes.

Attempts have been made to overcome the problems associated with the use of $Ta_2O_5$. Some of the efforts have focused on post-$Ta_2O_5$ treatments, such as annealing in the presence of ultraviolet light and ozone (UV-$O_3$ annealing), dry $O_2$ annealing, or rapid thermal nitridation (RTN), to repair the oxygen vacancies in the as-deposited chemical vapor deposited (CVD) $Ta_2O_5$, film by excited oxygen or nitrogen atoms. Other work has focused on depositing special layers around the $Ta_2O_5$ film to prevent oxidation during later processing. For example, U.S. Pat. No. 5,768,248 to Schuegraf involves the deposition of a dielectric nitride layer after the removal of an oxide layer on a capacitor plate. A $Ta_2O_5$ dielectric layer is then deposited, followed by a second nitride layer. The nitride layer restricts oxidation of the inner capacitor plate during subsequent annealing of the $Ta_2O_5$ layer. In U.S. Pat. No. 5,814,852 to Sandhu et al., a primarily amorphous diffusion barrier layer is deposited on the $Ta_2O_5$ dielectric layer.

Chemical vapor deposited (CVD) $Ta_2O_5$ dielectric films are prepared in an oxygen gas mixture at elevated temperatures. Consequently, the bottom electrode in a capacitor stack, onto which the $Ta_2O_5$ film is deposited tends to be severely oxidized by the process. This results in a high leakage current, as well as low capacitance.

Non-oxide electrodes have been shown to be promising electrodes for use with high dielectric constant oxide dielectrics. However, the resulting leakage current is high for thinner films or layers of oxide dielectrics such as $Ta_2O_5$. Therefore, there is a need for improved processes for incorporating non-oxide electrodes, such as TiN, TaN, WN, and W, and high dielectric constant oxide dielectric materials such as $Ta_2O_5$ and $Ba_xSr_{(1-x)}TiO_3$, in capacitor constructions having improved leakage current and for capacitors containing these materials.

SUMMARY OF THE INVENTION

The present invention meets these needs by providing a stabilized capacitor using non-oxide electrodes and high dielectric constant oxide dielectric materials and methods of making such capacitors. By "non-oxide" electrode, it is meant an electrically conductive material which does not contain any metal oxides. By "high dielectric constant oxide dielectric" materials we mean oxides of aluminum, barium, titanium, strontium, lead, zirconium, lanthanum, and niobium, including, but not limited to $Al_2O_3$, $Ba_xSr_{(1-x)}TiO_3$ ("BST"), $BaTiO_3$, $SrTiO_3$, $Ta_2O_5$, $Nb_2O_5$, $PbTiO_3$, $Pb(Zr,Ti)O_3$ ("PZT"), $(Pb,La)(Zr,Ti)O_3$ ("PLZT"), $(Pb,La)TiO_3$ ("PLT"), $KNO_3$, and $LiNbO_3$ and having a dielectric constant of at least about 20.

In accordance with one aspect of the present invention, the method includes providing a non-oxide electrode, oxidizing an upper surface of the non-oxide electrode, depositing a high dielectric constant oxide dielectric material on the oxidized surface of the non-oxide electrode, and depositing an upper layer electrode on the high dielectric constant oxide dielectric material.

The surface oxidation of the non-oxide electrode can be carried out in an atmosphere containing an oxidizing gas such as $O_2$, $O_3$, $H_2O$, or $N_2O$ at a temperature in the range of from about 250° to about 700° C. The oxidation can be performed in the same reaction chamber as the step of depositing the high dielectric constant oxide dielectric material prior to depositing the high dielectric constant oxide dielectric material. Preferably, the oxidation is a gas plasma treatment which is carried out at a temperature in the range of from about 250° to about 500° C., although other oxidation techniques such as furnace oxidation or rapid thermal oxidation (RTO) may be used. The high dielectric constant oxide dielectric material is selected from the group consisting of $Al_2O_3$, $Ba_xSr_{(1-)}TiO3$, $BaTiO_3$, $SrTiO_3$, $Ta_2O_5$, $Nb_2O_5$, $PbTiO_3$, $Pb(Zr,Ti)O_3$, $(Pb,La)(Zr,Ti)O_3$, $(Pb,La)TiO_3$, $KNO_3$, and $LiNbO_3$, and preferably comprises either $Ta_2O_5$ or $Ba_xSr_{(1-x)}TiO_3$.

Another aspect of the invention is a capacitor which includes a non-oxide electrode, the upper surface of which is oxidized. The capacitor includes a high dielectric constant oxide dielectric material adjacent the upper surface of the non-oxide electrode, and an upper layer electrode adjacent the high dielectric constant oxide dielectric material. In a preferred embodiment, the non-oxide electrode is preferably selected from the group consisting of TiN, TaN, WN, and W, and the high dielectric constant oxide dielectric material is selected from $Al_2O_3$, $Ta_2O_5$ and $Ba_xSr_{(1-x)}TiO_3$. The upper surface of the non-oxide electrode is preferably oxidized using an oxidizing gas plasma such as $O_3$.

Another aspect of the present invention is a DRAM cell and method of making it. In a preferred form, the method comprises providing a non-oxide electrode, oxidizing an upper surface of the non-oxide electrode, depositing a high dielectric constant oxide dielectric material on the non-oxide electrode, depositing an upper layer electrode on the layer of high dielectric constant oxide dielectric material, providing a field effect transistor having a pair of source/drain regions, electrically connecting one of said source/drain regions with the non-oxide electrode and electrically connecting the other of said source/drain regions with a bit line.

Accordingly, it is a feature of the present invention to provide a stabilized capacitor having improved leakage current characteristics using non-oxide electrodes and high dielectric constant oxide dielectric materials, their incorporation into DRAM cells, and methods of making such capacitors. These, and other features and advantages of the present invention, will become apparent from the following detailed description, the accompanying drawings, and the appended claims.

DETAILED DESCRIPTION OF THE PREFERRED EMBODIMENT

Figure 1:
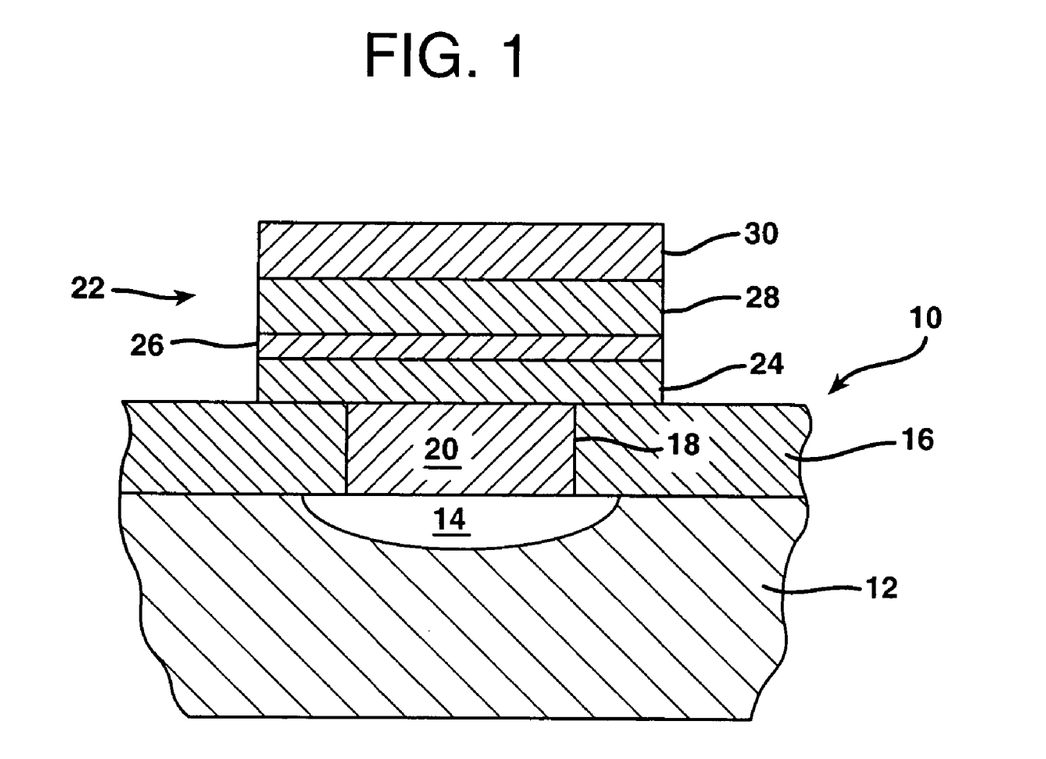
FIG. 1 is a diagrammatic fragmentary sectional view of a semiconductor substrate fragment made according to one embodiment of the present invention.

As shown in FIG. 1, a fragmentary view of a semiconductor substrate is indicated generally by reference numeral 10. As used herein, the term "semiconductor substrate" refers to silicon structures including silicon wafers, silicon structures in the process of fabrication, a semiconductor layer, including a semiconductor layer in the process of fabrication, and the like. The semiconductor substrate 10 includes a bulk silicon substrate 12 with a conductive diffusion area 14 formed therein. An insulating layer 16, which is typically a borophosilicate glass (BPSG), is provided over substrate 12. There is a contact opening 18 formed in the insulating layer 16 to diffusion area 14. A conductive material 20 fills contact opening 18 forming an electrically conductive plug, with conductive material 20 and oxide layer 16 having been planarized using conventional techniques. Conductive material 20 can be any suitable material, such as, for example, tungsten or conductively doped polysilicon. A barrier layer (not shown) of a material such as TiAlN may be present at the top of the plug.

The plug of conductive material 20 can be produced by initially forming conductively doped polysilicon to completely fill opening 18. The polysilicon layer can then be etched back using wet or dry etch processes, or by chemical-mechanical polishing (CMP) such that all conductive material has been removed from the upper surface of insulating layer 16. Preferably, the removal technique causes a slight recess of conductive material 20 within opening 18.

A capacitor construction generally indicated by reference numeral 22 is provided on insulating layer 16 and plug 20, with conductive plug 20 constituting a node to which electrical connection to capacitor 22 is made. Capacitor 22 comprises a non-oxide electrode 24 which is electrically conductive and has been provided and patterned over node 20. Examples of preferred materials for non-oxide electrode 24 include, but are not limited to, TiN, TaN, WN, and W. Generally, non-oxide electrode 24 has a thickness of from between about 200 to about 500 A.

The upper surface 26 of non-oxide electrode 24 is oxidized. The oxidation can be carried out at low temperatures (e.g., from about 250° to about 700° C.) in an atmosphere containing $O_2$, $O_3$, steam ($H_2O$), or $N_2O$. The oxidation may optionally be performed in the same reaction chamber where the high dielectric constant oxide dielectric material deposition occurs. Such oxidation takes places using an extended stabilization step under oxidizing conditions prior to deposition of the high dielectric constant oxide dielectric material. The oxidation is preferably performed using a gas plasma at a temperature in the range of from about 250° to 500° C. The oxidation forms a very thin layer of oxidized material on the surface of the non-oxide electrode. Generally, the thin oxidized layer has a thickness of from about 10 to about 100 A. For example, depending on the original non-oxide material, the thin oxidized layer may comprise TiON, TaON, WON, and/or WO.

A layer of high dielectric constant oxide dielectric material 28 is then deposited on the oxidized surface of non-oxide electrode 24. The high dielectric constant oxide dielectric material may be, but is not limited to, $Al_2O_3$, $Ta_2O_5$ and $Ba_xSr_{(1-x)}TiO_3$. One example of a process for depositing a high dielectric constant oxide dielectric material such as $Al_2O_3$, $Ta_2O_5$ or $Ba_xSr_{(1-x)}TiO_3$ includes using CVD techniques and metalorganic precursors. Typically, such metalorganic precursors would be flowed into a reactor at an appropriate rate under reduced pressure and elevated temperatures to form the dielectric layers 28 An upper layer electrode 30 is then deposited on high dielectric constant oxide dielectric material 28.

Figure 5:
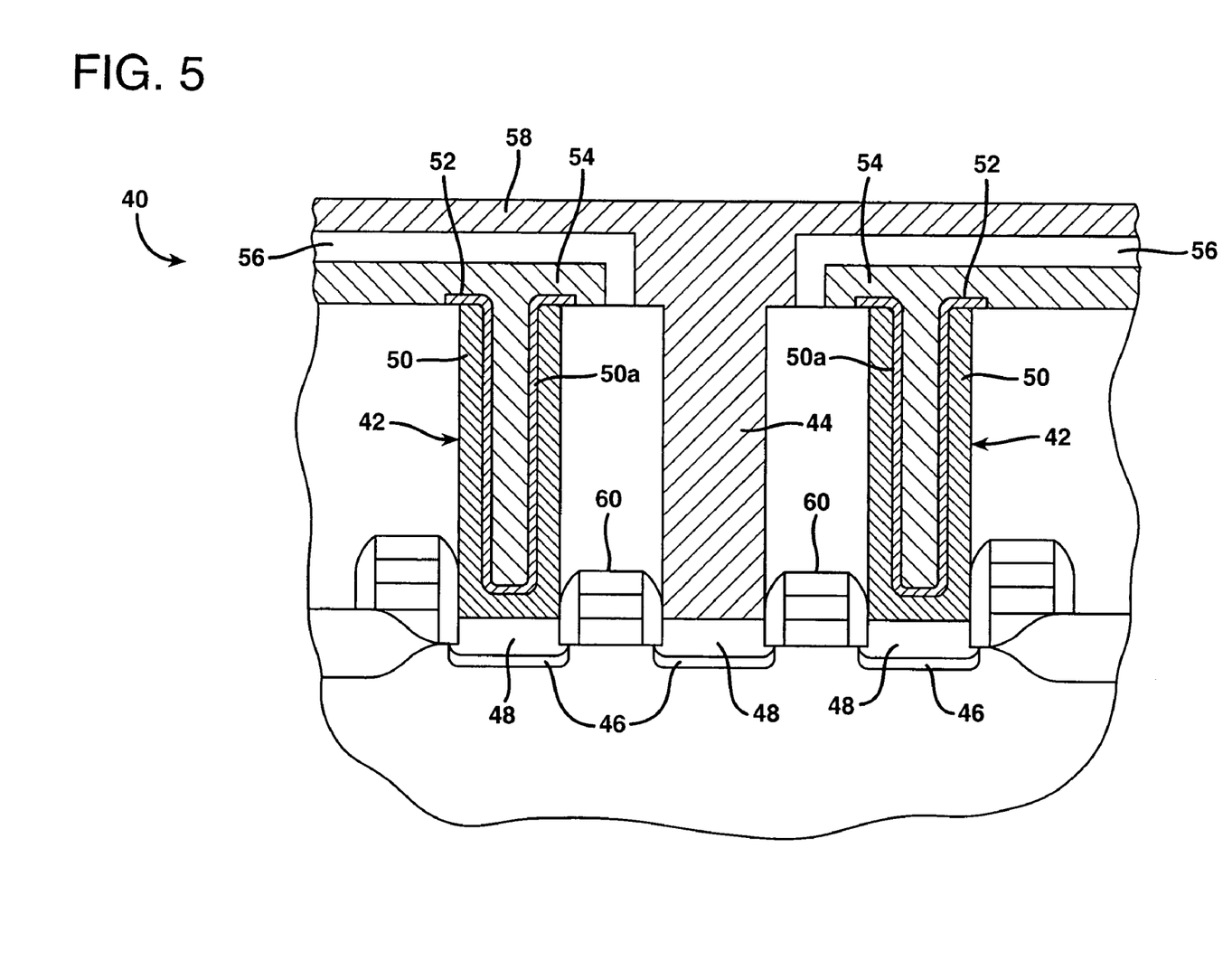
FIG. 5 is a diagrammatic fragmentary sectional view of another embodiment of the present invention.

Referring now to FIG. 5, another embodiment of the invention is shown which depicts the fabrication of DRAM circuitry. A semiconductor substrate 40 comprises two memory cells, each memory cell including a capacitor 42 and a shared bit contact 44. Capacitors 42 electrically connect with substrate diffusion regions 46 (source/drain regions) through silicide regions 48. For simplicity, capacitors 42 are shown as comprising a first capacitor electrode 50 having a thin oxidized surface 50a, a capacitor dielectric 52, and a second capacitor electrode/cell plate 54. These layers are fabricated of the materials described above, including conductive non-oxide electrode materials and the high dielectric constant oxide dielectric materials. These layers are processed as described above to provide the capacitor structure of the present invention. A dielectric layer 56 is formed over second capacitor plate 54. A bit line 58 is fabricated in electrical connection with bit contact 44. Word lines 60 are fabricated to enable selective gating of the capacitors relative to bit contact 44.

In order that the invention may be more readily understood, reference is made to the following example, which is intended to be illustrative of the invention, but is not intended to be limiting in scope.

EXAMPLE

A metal-insulator-metal capacitor test chip was prepared. The bottom electrode was a tungsten nitride (including WN, $W_2N$, $WN_x$, or mixtures) film deposited using CVD techniques to a thickness of about 450 A. Three slightly different $WN_x$ films were prepared, each having a different nucleation stage and different step coverage (identified as CVD $WN_x$ A, CVD $WN_x$ B, and CVD $WN_x$ C). The CVD $WN_x$ films were oxidized using a gas plasma generated from $O_3$ at 400° C. A film of $Ta_2O_5$ having a thickness of about 80 A was deposited on the plasma treated CVD $WN_x$ films. The upper electrode was a TiN film about 400 A thick deposited by physical vapor deposition (PVD) techniques. The capacitor was patterned using a photomask.

Figure 2:
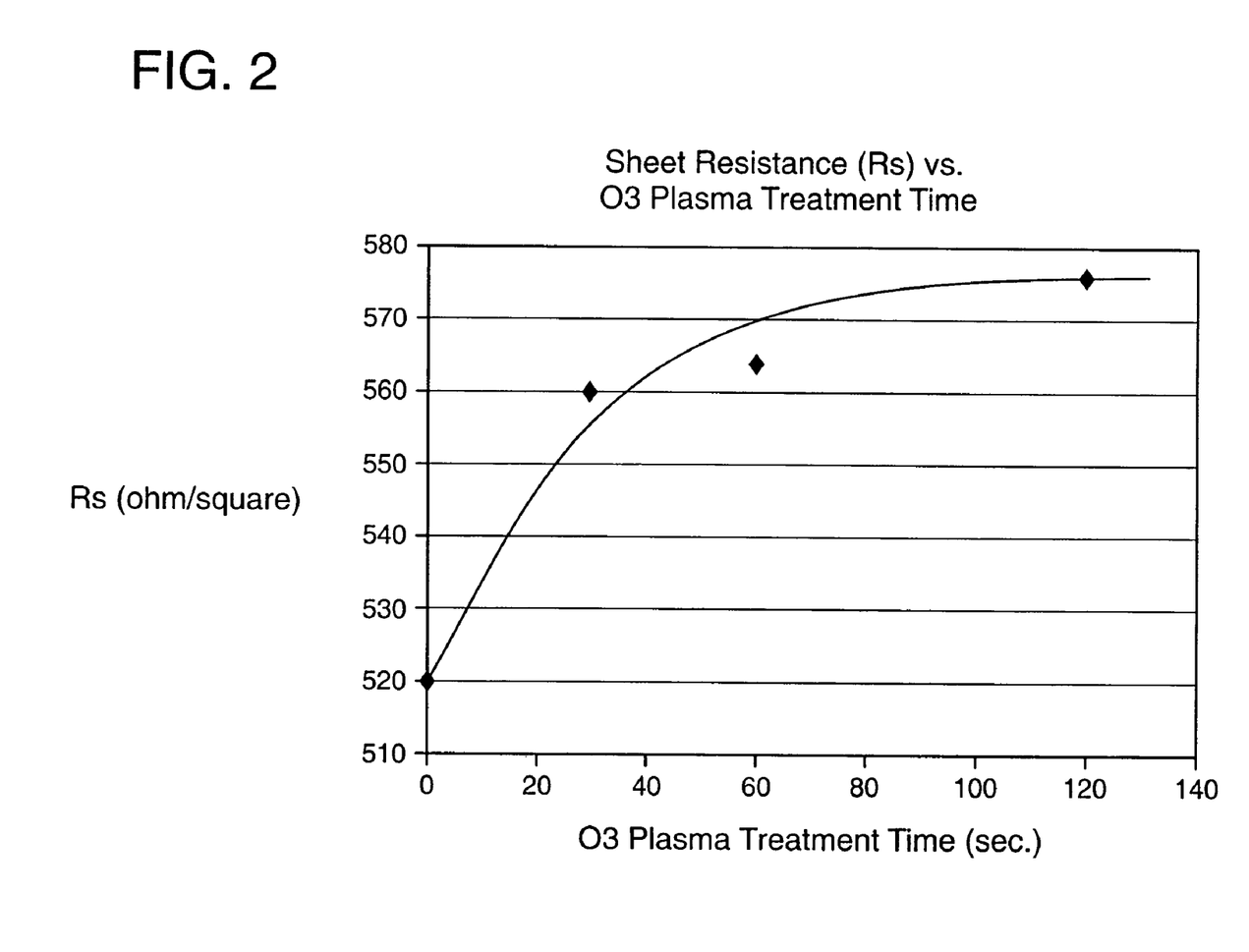
FIG. 2 is a graph of sheet resistance and $O_3$ gas plasma treatment time.

FIG. 2 shows the sheet resistance of the CVD $WN_x$ B film. The sheet resistance increased after gas plasma treatment, indicating that a thin layer of $WO_x$ formed at the film surface. The sheet resistance increased with increasing gas plasma treatment time. After about 30 seconds of gas plasma treatment, the increase in sheet resistance began to saturate, indicating that the formed passivation layer prevented further oxidation very effectively. The overall increase in sheet resistance after gas plasma treatment for 120 seconds was only about 10%, indicating that the passivation layer was thin. The thin passivation layer works to prevent further uncontrolled oxidation during $Ta_2O_5$ dielectric deposition and later thermal treatments. $WO_x$ has a very high dielectric constant (300), and therefore will not reduce the capacitance of the device.

Figure 3:
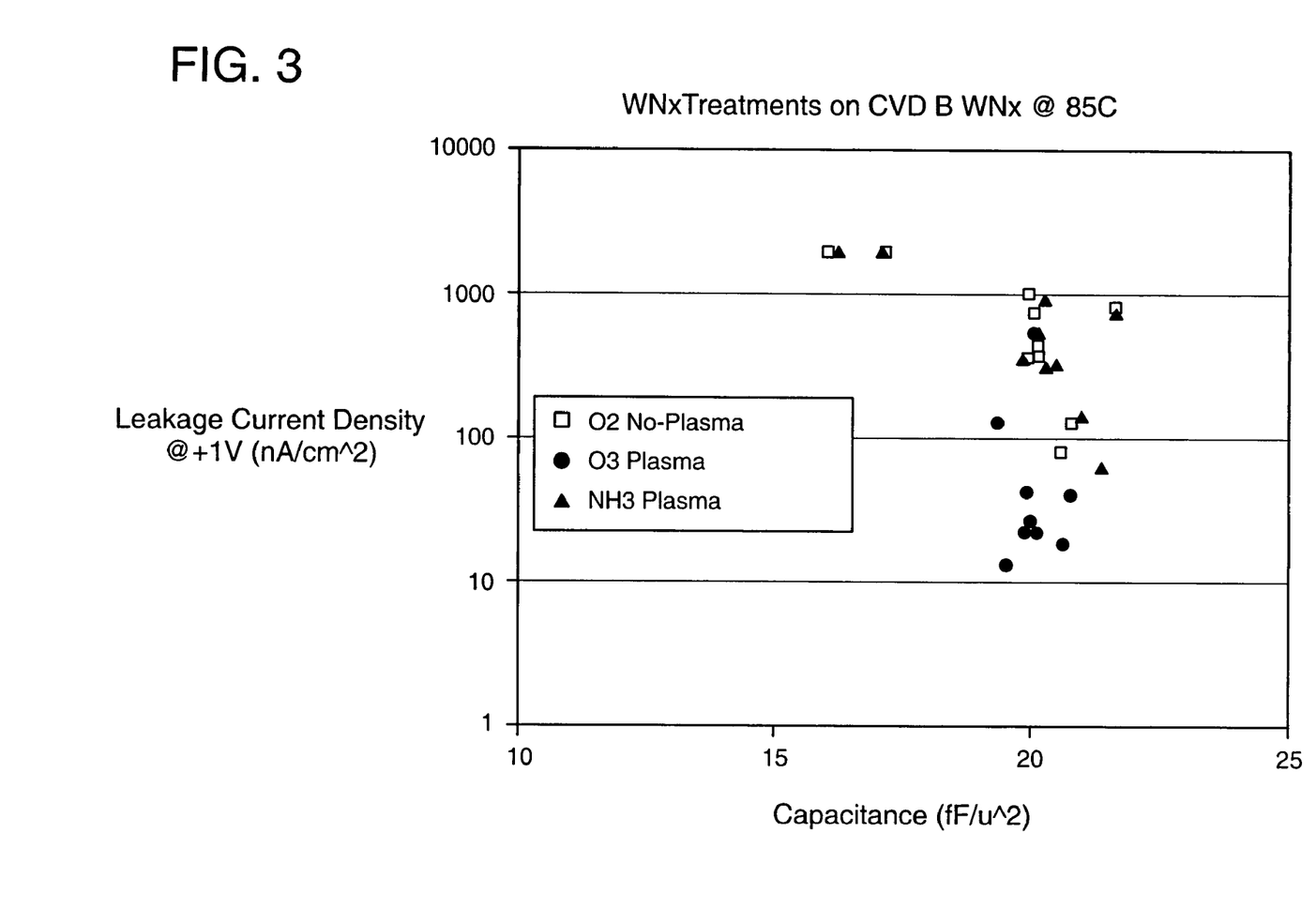
FIG. 3 is a graph of leakage current density and capacitance for one embodiment of the present invention.

FIG. 3 shows a comparison of the leakage current density and capacitance of CVD $WN_x$ B bottom electrode wafers which were untreated, gas plasma treated with $O_3$, and gas plasma treated with $NH_3$. The electrical data was measured at 85° C., with the leakage current density measured at +1 V and the capacitance at 0 V. The $O_3$ plasma treated capacitor had the lowest leakage density, but the capacitance was not reduced.

Figure 4:
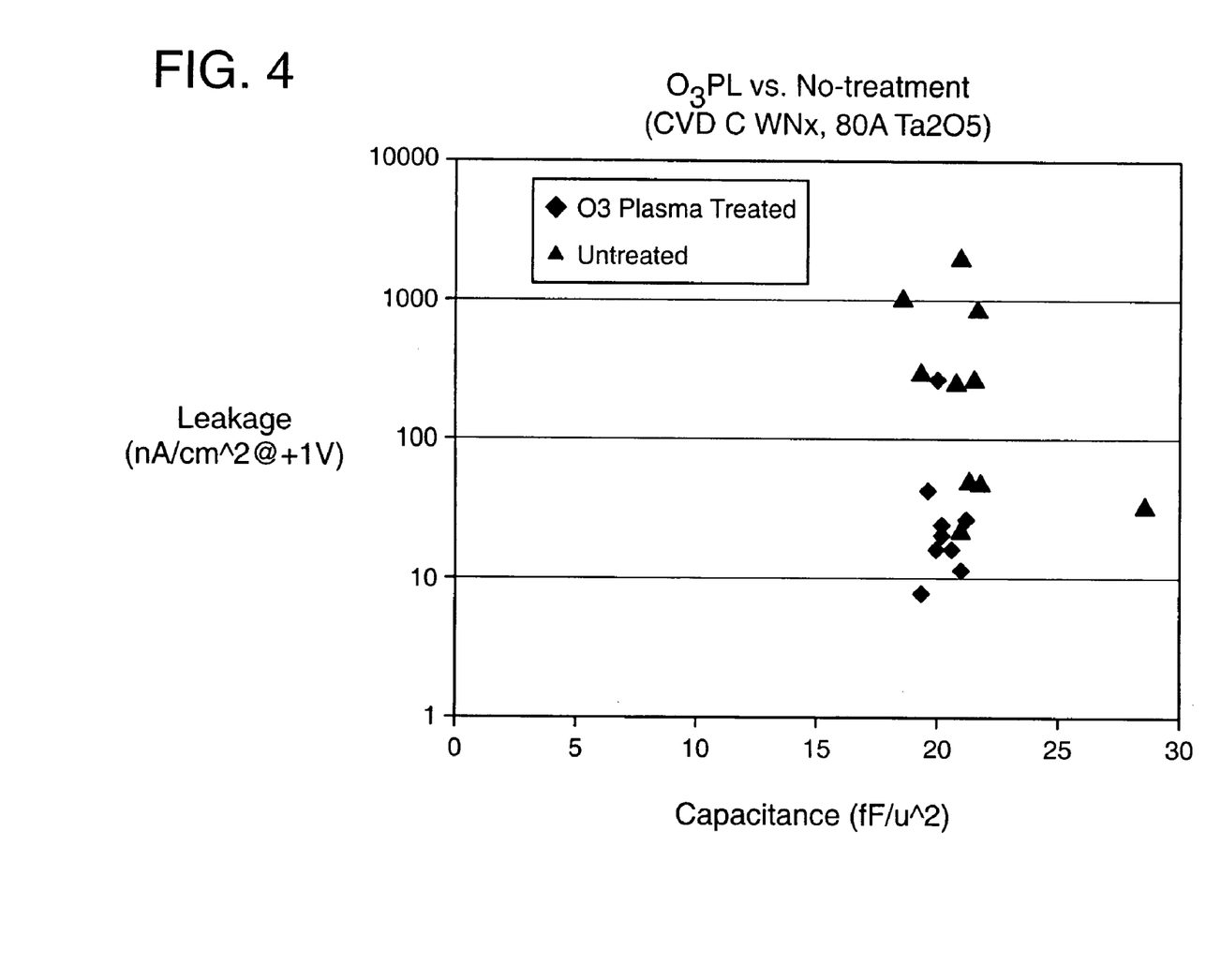
FIG. 4 is a graph of leakage current density and capacitance for one embodiment of the present invention.

FIG. 4 shows a comparison of the leakage current density and the capacitance of the CVD $WN_x$ C bottom electrode wafers which were untreated, and gas plasma treated with $O_3$. Again, the $O_3$ plasma treated capacitor had lower leakage density, but the capacitance was not reduced.

While not intended to be limited to any theory, it is believed that the formation of the thin oxide layer reduces the interface defects between the non-oxide bottom electrode and the high dielectric constant oxide dielectric material, providing reduced leakage current without severe degradation in dielectric capacitance because the thin oxide layer itself has a high dielectric constant.

While certain representative embodiments and details have been shown for the purpose of illustrating the invention, it will be apparent to those skilled in the art that various changes in the methods and apparatus disclosed herein may be made without departing from the scope of the invention, which is defined in the appended claims.

What is claims is:

1. A method for forming a capacitor comprising: providing a non-oxide electrode comprising a metal or metal nitride; oxidizing an upper surface of said non-oxide electrode using an $O_3$ gas plasma; depositing a high dielectric constant oxide dielectric material directly onto the oxidized surface of said non-oxide electrode; and depositing an upper layer electrode on said high dielectric constant oxide dielectric material.

2. A method as claimed in claim 1 wherein the oxidation of said upper surface of said non-oxide electrode is carried out at a temperature in the range of from about 250° to about 700° C.

3. A method as claimed in claim 1 wherein said high dielectric constant oxide dielectric material is selected from the group consisting of $Al_2O_3$, $Ta_2O_5$ and $Ba_xSr_{(1-x)}TiO_3$.

4. A method as claimed in claim 1 wherein the oxidation of said upper surface of said non-oxide electrode is performed in an oxide dielectric deposition chamber under oxidizing conditions prior to the deposition of said high dielectric constant oxide dielectric material.

5. A method as claimed in claim 1 wherein the oxidation is carried out at a temperature in the range of from about 250° to about 500° C.

6. A method for forming a capacitor comprising: providing a non-oxide electrode comprising a metal or metal nitride, in a deposition chamber oxidizing an upper surface of said non-oxide electrode using an $O_s$ gas plasma, in the same deposition chamber depositing a high dielectric constant dielectric material directly onto the oxidized surface of said non-oxide electrode, and depositing an upper layer electrode on said high dielectric constant oxide dielectric material.

7. A method for forming a capacitor comprising: providing a non-oxide electrode comprising a metal or metal nitride, oxidizing an upper surface of said non-oxide electrode using an $O_3$ gas plasma at a temperature in the range of from about 250° to about 700° C., depositing a high dielectric constant dielectric material directly onto the oxidized surface of said non-oxide electrode, and depositing an upper layer electrode on said high dielectric constant oxide dielectric material.

8. A method of forming a DRAM cell comprising providing a non-oxide electrode comprising a metal or metal nitride, oxidizing an upper surface of said non-oxide electrode using an O3 gas plasma, depositing a layer of a high dielectric constant oxide dielectric material directly onto the oxidized surface of said non-oxide electrode, depositing an upper layer electrode on said layer of said high dielectric constant oxide dielectric material, providing a field effect transistor having a pair of source/drain regions, electrically connecting one of said source/drain regions with said conductive oxide electrode and electrically connecting the other of said source/drain regions with a bit line.

9. A method for forming a capacitor comprising: providing a non-oxide electrode comprising a metal or metal nitride; oxidizing an upper surface of said non-oxide electrode using an $O_3$ gas plasma at a temperature of about 250° to about 700° C.; depositing a high dielectric constant oxide dielectric material directly onto the oxidized surface of said non-oxide electrode; and depositing an upper layer electrode on said high dielectric constant oxide dielectric material.

10. A method for forming a capacitor comprising: providing a non-oxide electrode comprising a metal or metal nitride; oxidizing an upper surface of said non-oxide electrode using an $O_3$ gas plasma; depositing a high dielectric constant oxide dielectric material directly onto the oxidized surface of said non-oxide electrode; and depositing an upper layer electrode comprising titanium nitride on said high dielectric constant oxide dielectric material.

11. A method for forming a capacitor comprising: providing a non-oxide electrode comprising tungsten nitride; oxidizing an upper surface of said non-oxide electrode using an $O_3$ gas plasma; depositing a high dielectric constant oxide dielectric material directly onto the oxidized surface of said non-oxide electrode; and depositing an upper layer electrode on said high dielectric constant oxide dielectric material.

* * * * *

UNITED STATES PATENT AND TRADEMARK OFFICE
CERTIFICATE OF CORRECTION

PATENT NO. : 7,192,828 B2 Page 1 of 1
APPLICATION NO. : 10/819420
DATED : March 20, 2007
INVENTOR(S) : Basceri et al.

It is certified that error appears in the above-identified patent and that said Letters Patent is hereby corrected as shown below:

In column 6, line 11, in Claim 6, delete "$O_s$" and insert -- $O_3$ --, therefor.

In column 6, line 30, in Claim 8, delete "O3" and insert -- $O_3$ --, therefor.

Signed and Sealed this

Thirteenth Day of November, 2007

JON W. DUDAS
*Director of the United States Patent and Trademark Office*